United States Patent
Yota et al.

(10) Patent No.: US 12,406,944 B2
(45) Date of Patent: Sep. 2, 2025

(54) MOISTURE BARRIER FOR METAL INSULATOR METAL CAPACITORS AND INTEGRATED CIRCUIT HAVING THE SAME

(71) Applicant: Skyworks Solutions, Inc., Irvine, CA (US)

(72) Inventors: Jiro Yota, Westlake Village, CA (US); Shiban Kishan Tiku, Camarillo, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 374 days.

(21) Appl. No.: 16/890,868

(22) Filed: Jun. 2, 2020

(65) Prior Publication Data

US 2021/0020587 A1 Jan. 21, 2021

Related U.S. Application Data

(60) Provisional application No. 62/860,016, filed on Jun. 11, 2019, provisional application No. 62/859,949, filed on Jun. 11, 2019.

(51) Int. Cl.
| | | |
|---|---|---|
| *H01L 23/00* | (2006.01) | |
| *H01L 23/06* | (2006.01) | |
| *H01L 23/66* | (2006.01) | |
| *H01Q 1/24* | (2006.01) | |
| *H10D 1/68* | (2025.01) | |

(52) U.S. Cl.
CPC ............ *H01L 23/564* (2013.01); *H01L 23/06* (2013.01); *H01Q 1/24* (2013.01); *H10D 1/692* (2025.01); *H01L 2223/6677* (2013.01)

(58) Field of Classification Search
None
See application file for complete search history.

(56) References Cited

U.S. PATENT DOCUMENTS

| 4,700,457 | A | | 10/1987 | Matsukawa | |
|---|---|---|---|---|---|
| 5,206,788 | A | * | 4/1993 | Larson | H01G 7/06 257/295 |
| 5,347,696 | A | | 9/1994 | Willer et al. | |
| 5,789,303 | A | * | 8/1998 | Leung | H01L 21/76895 257/E21.59 |
| 5,990,513 | A | * | 11/1999 | Perino | H01L 21/31608 257/315 |
| 6,162,666 | A | * | 12/2000 | Thakur | H01L 21/31691 438/164 |

(Continued)

*Primary Examiner* — Nishath Yasmeen
(74) *Attorney, Agent, or Firm* — Knobbe, Martens, Olson & Bear, LLP

(57) ABSTRACT

A semiconductor die includes a substrate layer, one or more metal layers disposed over the substrate layer, and one or more polyimide layers disposed over the substrate. Each polyimide layer can have a trench that separates a first portion of the polyimide layer that is adjacent a metal layer from a second portion of the polyimide layer. The trench(es) can be formed by etching the polyimide layer(s). A topcoat insulation layer can be disposed over the polyimide layers, a portion of the topcoat insulation layer disposed over the trench(es) define a moat. The topcoat insulation layer is impervious to moisture and the moat inhibits moisture from traveling along the one or more polymer interlevel dielectric layers from the second portion to the first portion.

20 Claims, 16 Drawing Sheets

(56) References Cited

U.S. PATENT DOCUMENTS

| | | | |
|---|---|---|---|
| 6,211,542 B1 | 4/2001 | Eastep et al. | |
| 6,324,048 B1 | 11/2001 | Liu | |
| 6,411,494 B1* | 6/2002 | Watt | H10D 84/212 361/306.3 |
| 6,549,396 B2* | 4/2003 | Brown | H10D 84/212 361/306.3 |
| 6,562,677 B1* | 5/2003 | Mikawa | H10D 1/692 257/532 |
| 6,624,501 B2* | 9/2003 | Shioga | H01L 24/06 257/532 |
| 7,298,050 B2* | 11/2007 | Kurihara | H01L 23/49827 438/668 |
| 7,838,965 B2* | 11/2010 | Klee | H10D 84/212 257/532 |
| 8,680,649 B2* | 3/2014 | Guegan | H10D 1/692 257/532 |
| 9,620,581 B2* | 4/2017 | Pelloquin | H01G 4/306 |
| 10,153,092 B2* | 12/2018 | Kumagae | H01G 4/306 |
| 2005/0000726 A1* | 1/2005 | Kimata | H05K 3/284 29/841 |
| 2006/0157792 A1* | 7/2006 | Konushi | H01G 4/306 257/359 |
| 2007/0205486 A1* | 9/2007 | Shioga | H10D 1/694 257/E23.079 |
| 2008/0145996 A1 | 6/2008 | Nomura et al. | |
| 2011/0110016 A1* | 5/2011 | Takeshima | H10D 1/68 361/311 |
| 2011/0304012 A1* | 12/2011 | Kim | H10D 86/85 257/532 |
| 2015/0060969 A1 | 3/2015 | Matsuura | |
| 2015/0189736 A1* | 7/2015 | Yang | H05K 1/0283 361/749 |
| 2017/0330924 A1* | 11/2017 | Kim | H10K 59/1213 |
| 2018/0102219 A1 | 4/2018 | Kumagae et al. | |
| 2019/0122822 A1* | 4/2019 | Fukahori | H01G 4/33 |
| 2020/0027982 A1 | 1/2020 | Iwaki | |
| 2021/0118821 A1 | 4/2021 | Yota et al. | |

* cited by examiner

MOISTURE BARRIER FOR METAL INSULATOR METAL CAPACITORS AND INTEGRATED CIRCUIT HAVING THE SAME

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 62/859,949, filed Jun. 11, 2019 and titled "MOISTURE BARRIER FOR METAL INSULATOR METAL CAPACITORS AND INTEGRATED CIRCUITS HAVING THE SAME," and U.S. Provisional Patent Application No. 62/860,016, filed Jun. 11, 2019 and titled "METHOD OF MAKING A MOISTURE BARRIER FOR METAL INSULATOR METAL CAPACITORS IN INTEGRATED CIRCUITS," are hereby incorporated by reference under 37 CFR 1.57.

BACKGROUND

Field

The present disclosure is directed to a moisture barrier for use in an integrated circuit, and more particularly to a moisture barrier for use in integrated circuits that use a polyimide interlayer insulator.

Description of the Related Art

Some semiconductor integrated circuits (ICs) use polyimide as an interlayer insulator. However, during operation under ambient conditions, as well as during high accelerated stress testing (HAST) test conditions (high temperature, high pressure, high moisture conditions), polyimide acts as a wick to draw moisture from outside and transport it to sensitive elements on the ICs, such as capacitors. Such moisture primarily travels from the die edges, bond pads and other cracks in the top coat of the ICs to sensitive elements. Once the moisture reaches silicon nitride dielectric material, the insulating/dielectric properties weaken as the moisture gets in, causing current to pass due to the presence of electric field across the capacitor. The moisture causes the breakdown strength of these sensitive elements to drop and thus lead to failure (e.g. a short of the capacitors), such as temperature, humidity and bias voltage (THB) failures.

SUMMARY OF CERTAIN INVENTIVE ASPECTS

Accordingly, there is a need for an improved manner to avoid moisture from reaching sensitive elements (e.g., capacitors), such as in semiconductor integrated circuits that use polyimide as an interlayer insulator.

In accordance with one aspect of the invention, a packaged module is provided with a moat (e.g., a no polyimide zone) that provides a moisture barrier. In one implementation, the moat is provided around one or more capacitors (e.g., provided around each capacitor). In another implementation, the moat is provided around the die.

In accordance with one aspect of the disclosure, a semiconductor die is provided. The semiconductor die can include a substrate layer, and one or more metal layers that are disposed over the substrate layer. The die can also include one or more polymer interlevel dielectric layers that are disposed over the substrate, each polymer interlevel dielectric layer has a trench that separates a first portion of the interlevel dielectric layer that is adjacent at least one of the one or more metal layers from a second portion of the interlevel dielectric layer. The die can also include a topcoat insulation layer that is disposed over the one or more polymer interlevel dielectric layers and defining a top surface of the die. A portion of the topcoat insulation layer can be disposed over the trench in at least one of the polymer interlevel dielectric layers to define a moat. The topcoat insulation layer is impervious to moisture and the moat inhibits moisture from traveling along the one or more polymer interlevel dielectric layers from the second portion to the first portion.

In an embodiment, the one or more polymer interlevel dielectric layers are one or more polyimide layers.

In an embodiment, the one or more metal layers are one or more electrodes of a capacitor.

In an embodiment, the semiconductor die further includes one or more insulation layers that are disposed at least partially over at least one of the one or more metal layers.

In an embodiment, the trench in each of the one or more polymer interlevel dielectric layers tapers toward the substrate layer.

In an embodiment, the one or more polymer interlevel dielectric layers are two layers. The trench in each of the two polymer interlevel dielectric layers are stepped relative to each other.

In an embodiment, the moat circumscribes a capacitor of the semiconductor die defined by at least one of the one or more metal layers.

In an embodiment, the moat circumscribes a plurality of electronic components on the semiconductor die.

In accordance with another aspect of the disclosure, a radiofrequency module is provided. The module can include a printed circuit board. The module can also include a semiconductor die mounted on the printed circuit board. The semiconductor die includes a substrate layer, and one or more metal layers disposed over the substrate layer. The die also includes one or more polymer interlevel dielectric layers disposed over the substrate. Each polymer interlevel dielectric layer has a trench that separates a first portion adjacent at least one of the one or more metal layers from a second portion. The die also includes a topcoat insulation layer that is disposed over the one or more polymer interlevel dielectric layers and defining a top surface of the die. A portion of the topcoat insulation layer is disposed over the trench in at least one of the polymer interlevel dielectric layers to define a moat. The topcoat insulation layer is impervious to moisture, and the moat inhibits moisture from traveling along the one or more polymer interlevel dielectric layers from the second portion to the first portion.

In an embodiment, the one or more polymer interlevel dielectric layers are one or more polyimide layers.

In an embodiment, the one or more metal layers are one or more electrodes of a capacitor.

In an embodiment, the radiofrequency module further includes one or more insulation layers that are disposed at least partially over at least one of the one or more metal layers.

In an embodiment, the trench in each of the one or more polymer interlevel dielectric layers tapers toward the substrate layer.

In an embodiment, the one or more polymer interlevel dielectric layers are two layers. The trench in each of the two polymer interlevel dielectric layers can be stepped relative to each other.

In an embodiment, the moat is arranged around a capacitor of the semiconductor die.

In an embodiment, the moat is arranged around a plurality of electronic components on the semiconductor die.

In accordance with another aspect of the disclosure, a wireless mobile device is provided. The wireless mobile device can include one or more antennas, and a front end system that communicates with the one or more antennas. The wireless mobile device can also include a semiconductor die. The die includes a substrate layer, and one or more metal layers disposed over the substrate layer. The die also includes one or more polymer interlevel dielectric layers that is disposed over the substrate. Each polymer interlevel dielectric layer has a trench that separates a first portion adjacent at least one of the one or more metal layers from a second portion. The die also includes a topcoat insulation layer that is disposed over the one or more polymer interlevel dielectric layers and defining a top surface of the die. A portion of the topcoat insulation layer is disposed over the trench in at least one of the polymer interlevel dielectric layers to define a moat. The topcoat insulation layer is impervious to moisture, and the moat inhibits moisture from traveling along the one or more polymer interlevel dielectric layers from the second portion to the first portion.

In an embodiment, the one or more polymer interlevel dielectric layers are one or more polyimide layers.

In an embodiment, the one or more metal layers are one or more electrodes of a capacitor.

In an embodiment, the wireless mobile device further includes one or more insulation layers that are disposed at least partially over at least one of the one or more metal layers.

In an embodiment, the trench in each of the one or more polymer interlevel dielectric layers tapers toward the substrate layer.

In an embodiment, the one or more polymer interlevel dielectric layers are two layers. The trench in each of the two polymer interlevel dielectric layers can be stepped relative to each other.

In an embodiment, the moat is arranged around a capacitor of the semiconductor die.

In an embodiment, the moat is arranged around a plurality of electronic components on the semiconductor die.

In accordance with another aspect of the disclosure, a method of making a semiconductor die is provided. The method can include forming or providing a substrate layer, forming or applying one or more metal layers over the substrate layer, and forming or applying one or more polymer interlevel dielectric layers over the substrate layer. At least a first portion of the one or more polymer interlevel dielectric layers is adjacent at least one of the one or more metal layers. The method can also include forming a trench in the one or more polymer interlevel dielectric layers to separate the first portion from a second portion of the one or more polymer interlevel dielectric layers. The method can also include forming or applying a topcoat insulation layer over the one or more polymer interlevel dielectric layers. A portion of the topcoat insulation layer is disposed over the trench in at least one of the polymer interlevel dielectric layers to define a moat. The topcoat insulation layer being impervious to moisture. The moat inhibits moisture from traveling along the one or more polymer interlevel dielectric layers from the second portion to the first portion.

In an embodiment, the one or more polymer interlevel dielectric layers are one or more polyimide interlevel dielectric layers.

In an embodiment, the one or more polymer interlevel dielectric layers are two polymer interlevel dielectric layers. The trench can be formed in each of the two polymer interlevel dielectric layers in a stepped manner relative to each other.

In an embodiment, forming the trench includes etching the one or more polymer interlevel dielectric layers to form the trench.

In an embodiment, the one or more metal layers are one or more electrodes of a capacitor.

In an embodiment, the method further includes forming or applying one or more insulation layers at least partially over at least one of the one or more metal layers.

In an embodiment, the moat is arranged around a capacitor of the semiconductor die.

In an embodiment, the moat is arranged around a plurality of electronic components on the semiconductor die.

In accordance with another aspect of the disclosure, a method of making a radiofrequency module is provided. The method can include forming or providing a printed circuit board that includes a substrate layer, forming or providing a semiconductor die, and mounting the semiconductor die on the printed circuit board. Forming or providing the semiconductor die includes forming or providing a substrate layer, forming or applying one or more metal layers over the substrate layer, and forming or applying one or more polymer interlevel dielectric layers over the substrate layer. At least a first portion of the one or more polymer interlevel dielectric layers is adjacent at least one of the one or more metal layers. Forming or providing the die further includes forming a trench in the one or more polymer interlevel dielectric layers to separate the first portion from a second portion of the one or more polymer interlevel dielectric layers, and forming or applying a topcoat insulation layer over the one or more polymer interlevel dielectric layers. A portion of the topcoat insulation layer is disposed over the trench in at least one of the polymer interlevel dielectric layers to define a moat. The topcoat insulation layer is impervious to moisture, and the moat inhibits moisture from traveling along the one or more polymer interlevel dielectric layers from the second portion to the first portion.

In an embodiment, the one or more polymer interlevel dielectric layers are one or more polyimide interlevel dielectric layers.

In an embodiment, the one or more polymer interlevel dielectric layers are two polymer interlevel dielectric layers. The trench can be formed in each of the two polymer interlevel dielectric layers in a stepped manner relative to each other.

In an embodiment, forming the trench includes etching the one or more polymer interlevel dielectric layers to form the trench.

In an embodiment, the one or more metal layers are one or more electrodes of a capacitor.

In an embodiment, the method can further include forming or applying one or more insulation layers at least partially over at least one of the one or more metal layers.

In an embodiment, forming the trench includes tapering the trench toward the substrate layer.

In an embodiment, the moat is arranged around a capacitor of the semiconductor die.

In an embodiment, the moat is arranged around a plurality of electronic components on the semiconductor die.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
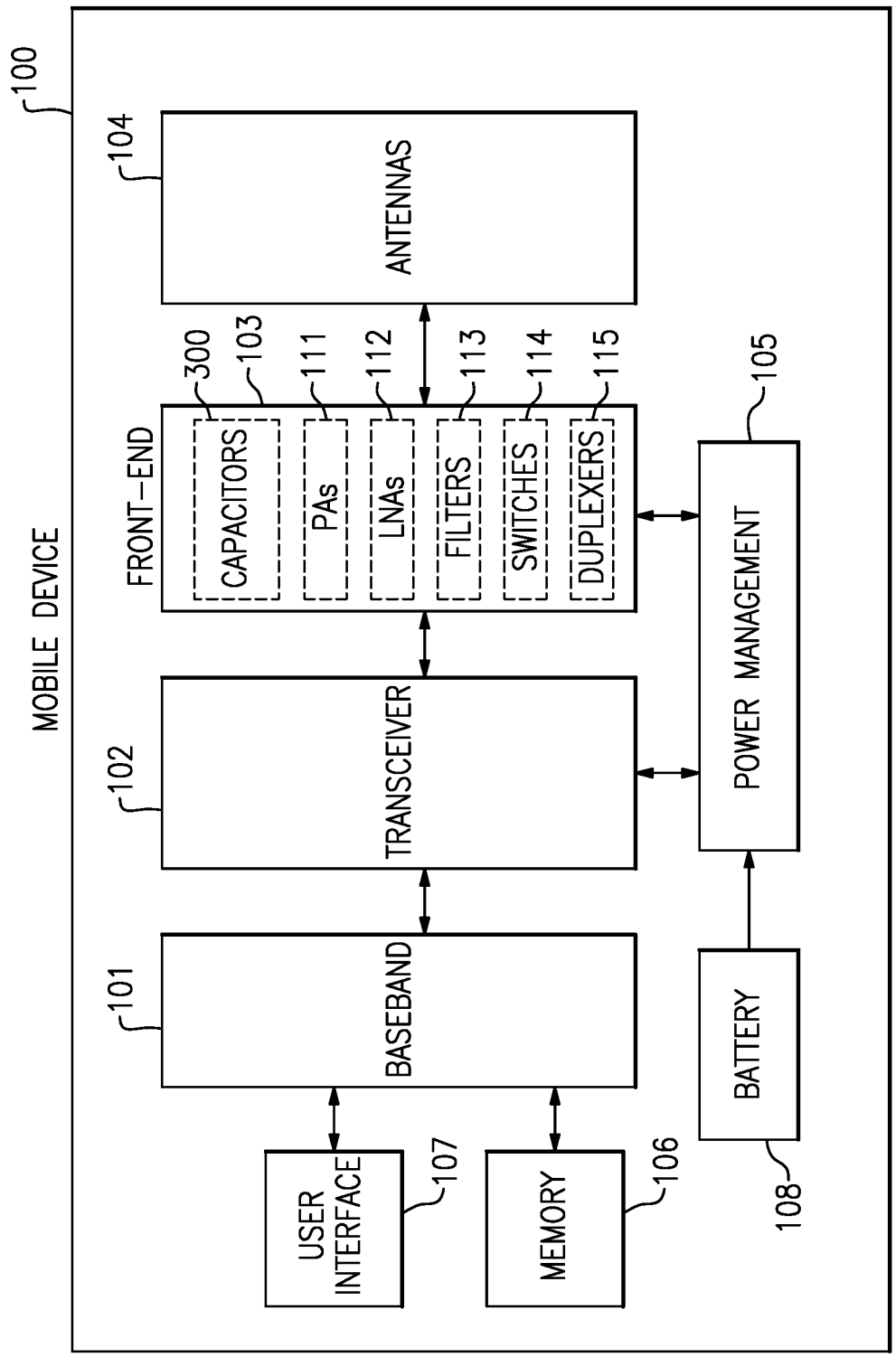
FIG. 1 is a schematic diagram of one embodiment of a wireless device.

The following detailed description of certain embodiments presents various descriptions of specific embodiments. However, the innovations described herein can be embodied in a multitude of different ways, for example, as defined and covered by the claims. In this description, reference is made to the drawings were like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP introduced Phase 1 of fifth generation (5G) technology in Release 15 and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, analog devices, radiofrequency devices, and communication systems using advanced cellular technologies, such as LTE-Advanced, LTE-Advanced Pro, and/or 5G NR.

FIG. 1 is a schematic diagram of one embodiment of a wireless device 100. The wireless device 100 can be, for example but not limited to, a portable telecommunication device such as a mobile cellular-type telephone. The wireless device 100 can include one or more of a baseband system 101, a transceiver 102, a front end system 103, one or more antennas 104, a power management system 105, a memory 106, a user interface 107, a battery 108 (e.g., direct current (DC) battery). Other additional components, such as a speaker, display and keyboard can optionally be connected to the baseband system 101. The battery 108 can provide power to the wireless device 100.

It should be noted that, for simplicity, only certain components of the wireless device 100 are illustrated herein. The control signals provided by the baseband system 101 control the various components within the wireless device 100. Further, the function of the transceiver 102 can be integrated into separate transmitter and receiver components.

The wireless device 100 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 102 generates RF signals for transmission and processes incoming RF signals received from the antennas 104. It will be understood that various functionalities associated with the transmission and receiving of RF signals can be achieved by one or more components that are collectively represented in FIG. 1 as the transceiver 102. In one example, separate components (for instance, separate circuits or dies) can be provided for handling certain types of RF signals.

The front end system 103 aids in conditioning signals transmitted to and/or received from the antennas 104. In the illustrated embodiment, the front end system 103 includes one or more power amplifiers (PAs) 111, low noise amplifiers (LNAs) 112, filters 113, switches 114, duplexers 115 and capacitors 300. However, other implementations are possible.

For example, the front end system 103 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the wireless device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 104 can include antennas used for a wide variety of types of communications. For example, the antennas 104 can include antennas for transmitting and/or receiving signals associated with a wide variety of frequencies and communications standards.

In certain implementations, the antennas 104 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless device 100 can operate with beamforming in certain implementations. For example, the front end system 103 can include phase shifters having variable phase controlled by the transceiver 102. Additionally, the phase shifters are controlled to provide beam formation and directivity for transmission and/or reception of signals using the antennas 104. For example, in the context of signal transmission, the phases of the transmit signals provided to the antennas 104 are controlled such that radiated signals from the antennas 104 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 104 from a particular direction. In certain implementations, the antennas 104 include one or more arrays of antenna elements to enhance beamforming.

The baseband system 101 is coupled to the user interface 107 to facilitate processing of various user input and output (I/O), such as voice and data. The baseband system 101 provides the transceiver 102 with digital representations of transmit signals, which the transceiver 102 processes to generate RF signals for transmission. The baseband system 101 also processes digital representations of received signals provided by the transceiver 102. As shown in FIG. 1, the baseband system 101 is coupled to the memory 106 of facilitate operation of the wireless device 100.

The memory 106 can be used for a wide variety of purposes, such as storing data and/or instructions to facilitate the operation of the wireless device 100 and/or to provide storage of user information.

The power management system 105 provides a number of power management functions of the wireless device 100. In certain implementations, the power management system 105 includes a PA supply control circuit that controls the supply voltages of the power amplifiers 111. For example, the power management system 105 can be configured to change the supply voltage(s) provided to one or more of the power amplifiers 111 to improve efficiency, such as power added efficiency (PAE).

As shown in FIG. 1, the power management system 105 receives a battery voltage from the battery 108. The battery 108 can be any suitable battery for use in the wireless device 100, including, for example, a lithium-ion battery.

Figure 2A:
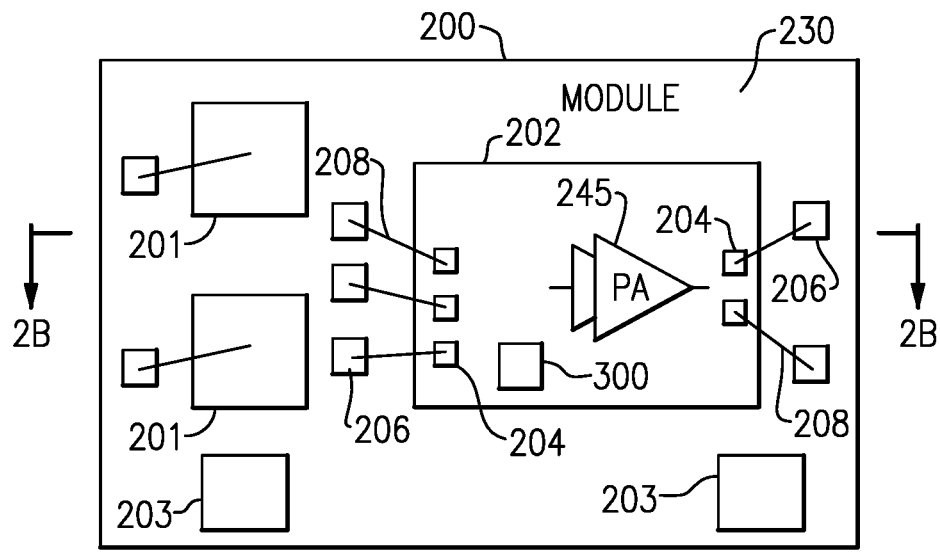
FIG. 2A is a schematic diagram of one embodiment of a packaged module.
Figure 2B:
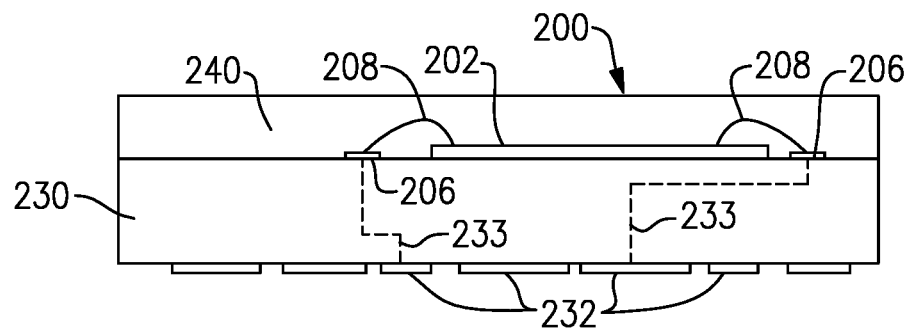
FIG. 2B is a schematic diagram of a cross-section of the packaged module of FIG. 2A taken along the lines 2B-2B.

FIG. 2A is a schematic diagram of one embodiment of a packaged module 200. FIG. 2B is a schematic diagram of a cross-section of the packaged module 200 of FIG. 2A taken along the lines 2B-2B.

The packaged module 200 includes radio frequency components 201, a semiconductor die 202, surface mount devices 203, wirebonds 208, a package substrate 230, an encapsulation structure 240, and one or more capacitors 300. The package substrate 230 includes pads 206 formed from conductors disposed therein. Additionally, the semiconductor die 202 includes pins or pads 204, and the wirebonds 208 have been used to connect the pads 204 of the die 202 to the pads 206 of the package substrate 220.

The semiconductor die 202 includes a power amplifier 245, which can be implemented in accordance with one or more features disclosed herein.

The package substrate 230 can be configured to receive a plurality of components such as radio frequency components 201, the semiconductor die 202 and the surface mount devices 203, which can include, for example, surface mount capacitors and/or inductors. In one implementation, the radio frequency components 201 include integrated passive devices (IPDs).

As shown in FIG. 2B, the packaged module 200 is shown to include a plurality of contact pads 232 disposed on the side of the packaged module 200 opposite the side used to mount the semiconductor die 202. Configuring the packaged module 200 in this manner can aid in connecting the packaged module 200 to a circuit board, such as a phone board of a mobile device. The example contact pads 232 can be configured to provide radio frequency signals, bias signals, and/or power (for example, a power supply voltage and ground) to the semiconductor die 202 and/or other components. As shown in FIG. 2B, the electrical connections between the contact pads 232 and the semiconductor die 202 can be facilitated by connections 233 through the package substrate 230. The connections 233 can represent electrical paths formed through the package substrate 220, such as connections associated with vias and conductors of a multilayer laminated package substrate.

In some embodiments, the packaged module 200 can also include one or more packaging structures to, for example, provide protection and/or facilitate handling. Such a packaging structure can include overmold or encapsulation structure 240 formed over the package substrate 230 and the components and die(s) disposed thereon.

It will be understood that although the packaged module 200 is described in the context of electrical connections based on wirebonds, one or more features of the present disclosure can also be implemented in other packaging configurations, including, for example, flip-chip configurations.

Moisture Barrier

Figure 3A:
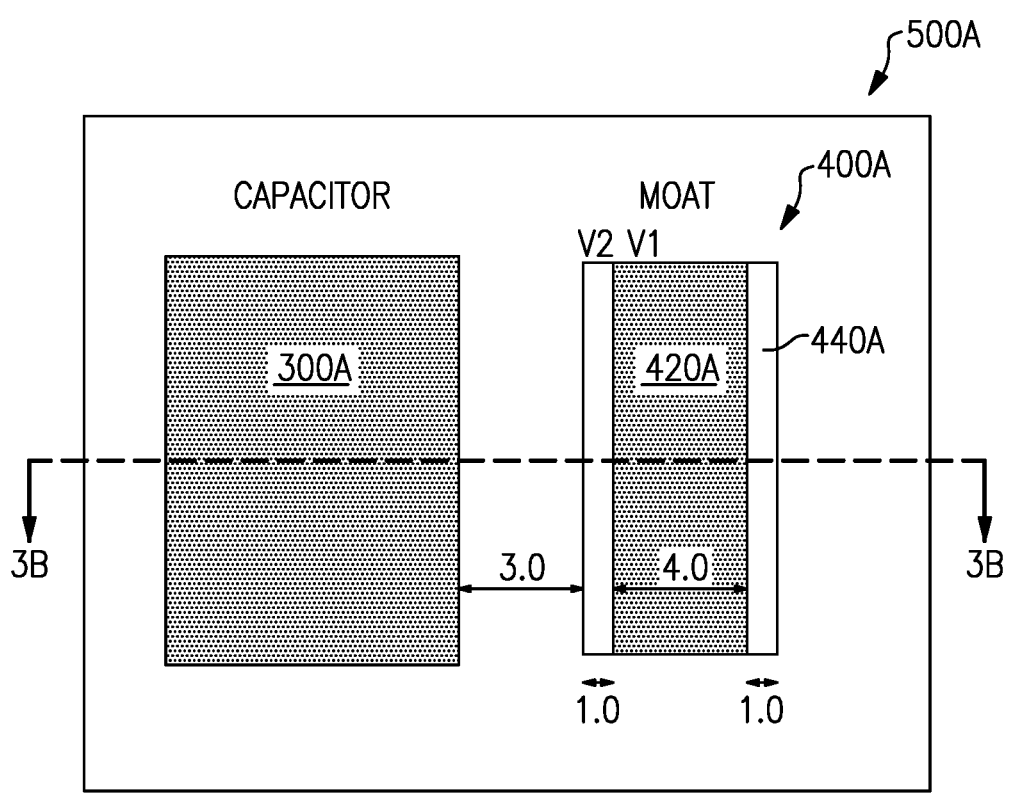
FIG. 3A is a schematic top view of a die with a capacitor and moat without any connections over the moat.
Figure 3B:
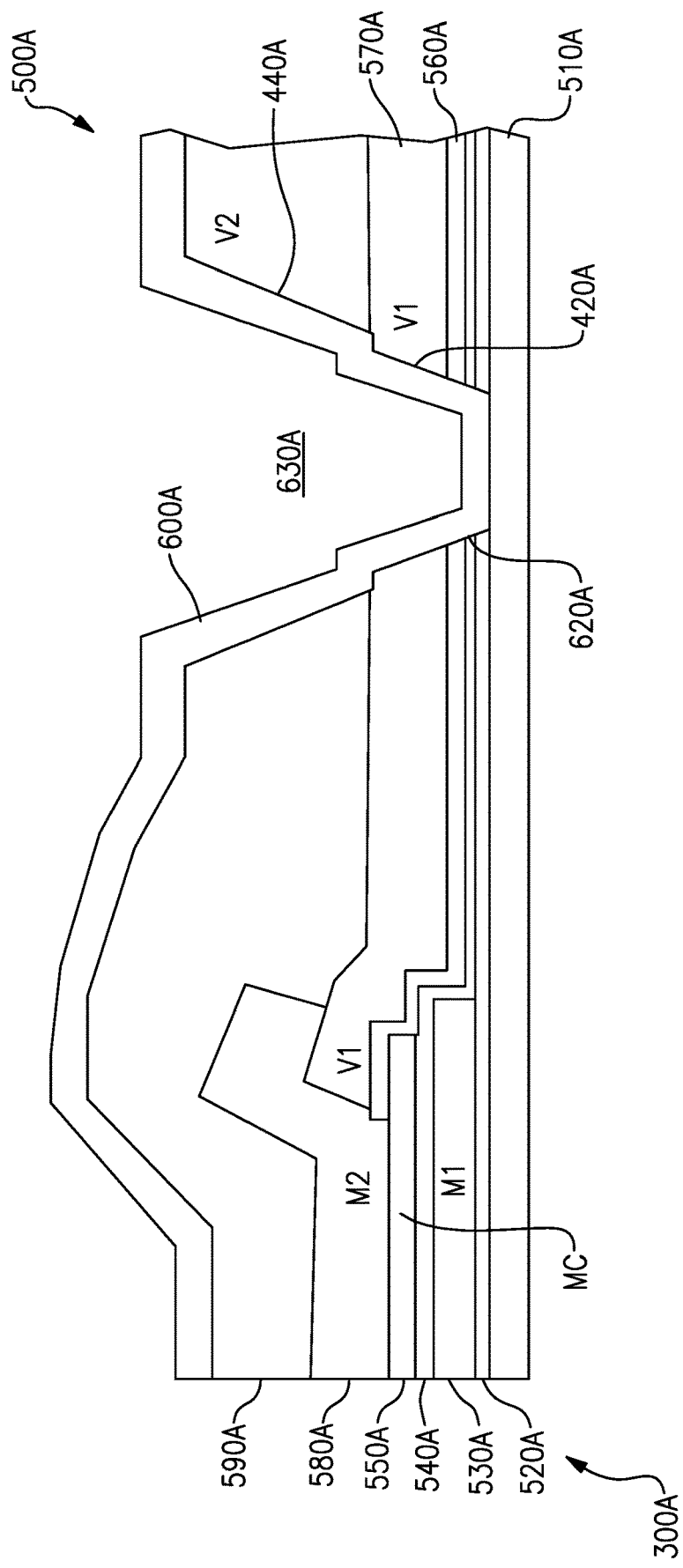
FIG. 3B is a cross-sectional side view of the die in FIG. 3A including the moat.

FIGS. 3A-3B schematically illustrate a die 500A with a capacitor 300A and a moat 400A. FIG. 3A shows only a portion of the moat 400A. In one implementation, the moat 400A can extend about (e.g., completely circumscribe or surround) the capacitor 300A to provide a moisture barrier (e.g., a local moat) about the capacitor 300A. In another implementation, the moat 400A can extend about (e.g., completely circumscribe or surround) one or more (e.g., a plurality of) components (e.g., a plurality of capacitors) to provide a moisture barrier about the one or more (e.g., a plurality of) components. In still another implementation, the moat 400A can extend about (e.g., completely circumscribe or surround) at least a portion of a die, such as the die 500A, to provide a moisture barrier from defects on one or more edges of the die.

FIG. 3B shows a cross-section of the die 500A along line 3B-3B in FIG. 3A. The die 500A includes a substrate layer 510A. Optionally, the substrate layer 510A can be made of gallium arsenide (GaAs). An insulation layer 520A is disposed over (e.g., directly over, adjacent) the substrate layer 510A. Optionally, the insulation layer 520A can be made of silicon nitride (SiN).

A first metal layer 530A (M1) can be disposed over (e.g., directly over, adjacent) at least a portion of the insulation layer 520A. The first metal layer 530A can define a first electrode and extend along a length smaller than a length of the insulation layer 520A. A second insulation layer 540A can be disposed over (e.g., directly over, adjacent) the first metal layer 530A and disposed over the insulation layer 520A. The second insulation layer 540A can optionally be made of silicon nitride.

A second metal layer 550A (MC) can be disposed over at least a portion of (e.g., less than an entire length of) the second insulation layer 540A. The second metal layer 550A can define a second electrode and extend along a length smaller than a length of the second insulation layer 540A. The second metal layer 550A can be shorter in length than the first metal layer 530A. A third insulation layer 560A can be disposed over at least a portion of (e.g., less than an entire length of) the second metal layer 550A and can extend over at least a portion of the second insulation layer 540A. A first interlayer insulator layer 570A (V1) is disposed over (e.g., directly over, adjacent) the third insulation layer 560A. The first interlayer insulator layer 570A can be made of poly-imide. However, the first interlayer insulator layer 570A can be made of other suitable polymer materials.

A third metal layer 580A (M2) can be disposed over (e.g., directly over, adjacent) at least a portion of (e.g., less than an entire length of) the second metal layer 550A, as well as over at least a portion of (e.g., less than an entire length of) the first interlayer insulator layer 570A. the third metal layer 580A can define a third electrode and extend along a length approximately equal to the length of the first metal layer 530A. A second interlayer insulator layer 590A (V2) can be disposed over (e.g., directly over, adjacent) the third metal layer 580A and over (e.g., directly over, adjacent) at least a portion of the first interlayer insulator layer 570A. the second interlayer insulator layer 590A can be made of polyimide. However, the second interlayer insulator layer 590A can be made of other suitable polymer materials. A topcoat insulation layer (or fourth insulation layer) 600A can be disposed over (e.g. directly over, adjacent) at least a portion of the second interlayer insulator layer 590A and at last a portion of the first interlayer insulator layer 570A. The topcoat insulation layer 600A can optionally be made of silicon nitride, and is impervious to moisture, thereby providing a moisture barrier.

The capacitor 300A can be defined by one or more of the first, second and third metal layers 530A, 550A, 580A. The moat 400A can be defined in the die 500A by a trench portion 420A defined in the first interlayer insulator layer 570A and a trench portion 440A defined in the second interlayer insulator layer 590A to define a trench 630A in the topcoat insulation layer 600A that extends over the trench portions 420A, 440A. The trench portion 440A can be wider than the trench portion 420A, both having a tapered shape. In one implementation, as shown in FIG. 3A where all dimensions are in microns, the trench portion 440A can be approximately 6 microns wide at its widest point, and the trench portion 420A can be approximately 4 microns wide at its widest point. However, the width of the trench portions 420A, 440A can have other suitable dimensions. An inner surface of the trenches 420A, 440A optionally are offset to define a stepped tapered shape for the trench 630A. As discussed above, the topcoat insulation layer 600A extends over (e.g., adjacent) the trench portions 420A, 440A in the first and second interlayer insulator layers 570A, 590A. As shown in FIG. 3B, the trench 630A of the topcoat insulation layer 600A can also extend within a trench portion 620A defined in the first and second insulation layers 520A, 540A to a location over (e.g., adjacent) a portion of the substrate 510A. Therefore, the topcoat insulation layer 600A advantageously provides a moisture barrier (e.g., with the trench 630A) between different portions of the first interlayer insulator layer 570A and between different portions of the second interlayer insulator layer 590A, thereby inhibiting (e.g., preventing) moisture from flowing from one portion (e.g., right side of moat 400A in FIG. 3B) of the first and second interlayer insulator layers 570A, 590A to another portion (e.g., left side of moat 400A in FIG. 3B) of the first and second interlayer insulator layers 570A, 590A. Such a moisture barrier advantageously inhibits (e.g., prevents) damage to the capacitor 300A from exposure to moisture that may travel along one or both of the first and second interlayer insulator layers 570A, 590A (e.g., from defects on a top portion or an edge portion of the die 500A). As shown in FIGS. 3A-3B, there is no electrical connection across the moat 400A. That is, none of the first, second or third metal layers 530A, 550A, 580A extend across the moat 400A or trench 630A. Further, as shown in FIG. 3A, in one implementation, the moat 400A can be spaced approximately 3 microns from the capacitor 300A. However, the spacing between the moat 400A and the capacitor 300A can have other suitable dimensions.

Figure 4A:
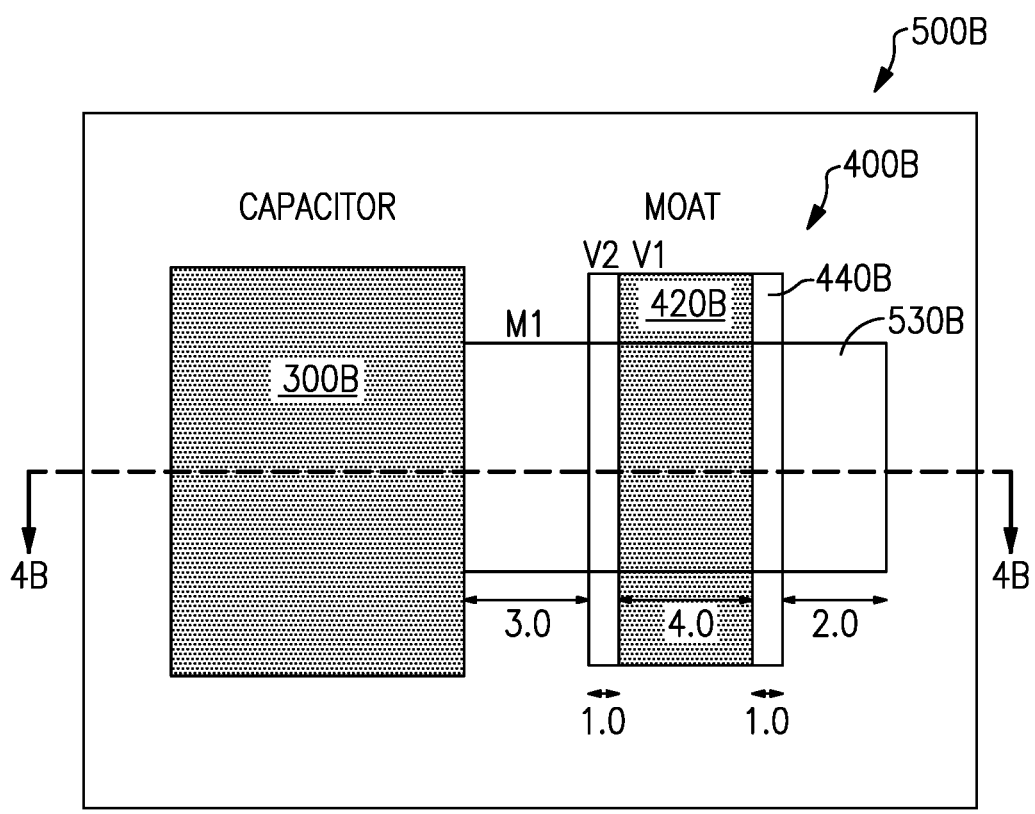
FIG. 4A is a schematic top view of a die with a capacitor and moat with a connection over the moat.
Figure 4B:
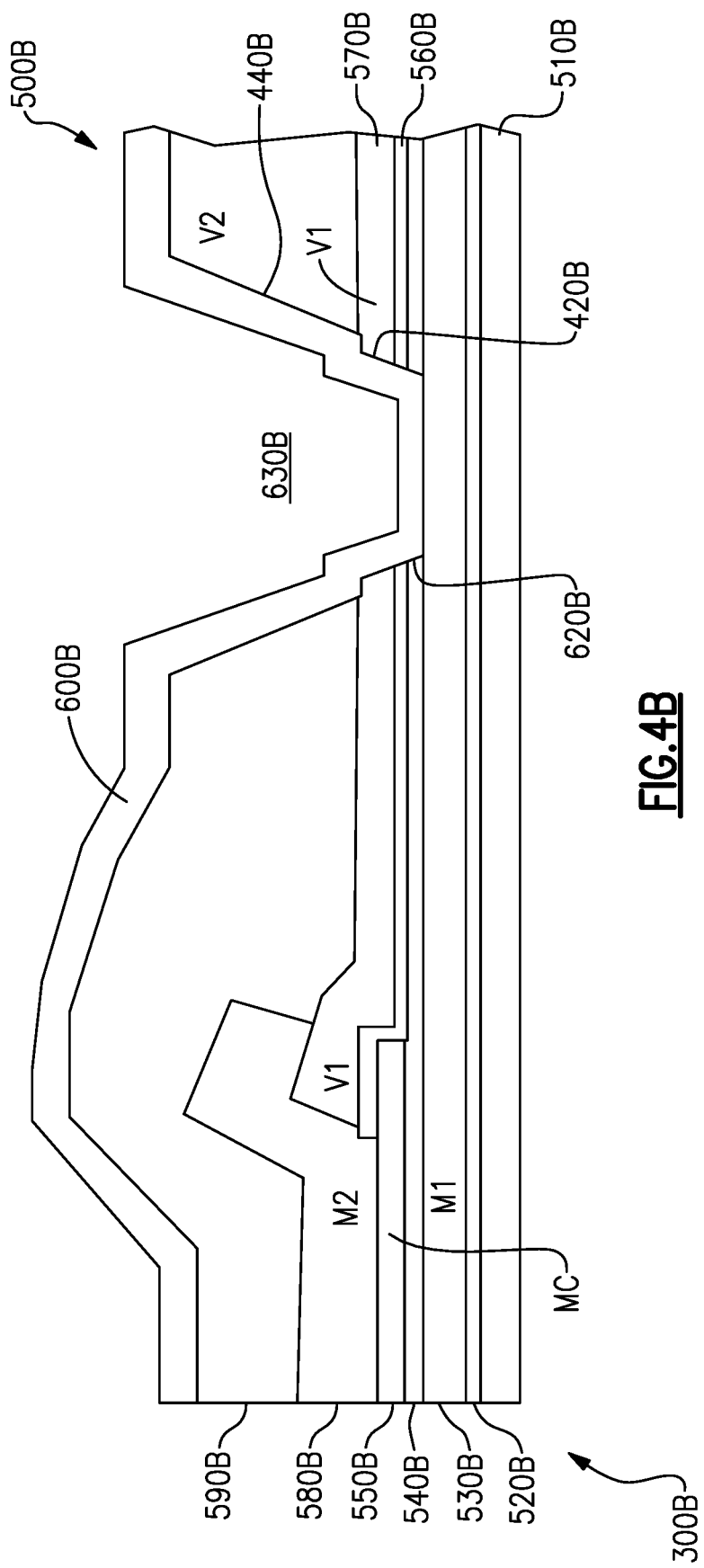
FIG. 4B is a cross-sectional side view of the die in FIG. 4A including the moat.

FIGS. 4A-4B schematically illustrate a top view and a cross-sectional view along line 4B-4B in FIG. 4A, respectively, of a die 500B with a capacitor 300B and a moat 400B. Some of the features of the die 500B, capacitor 300B and moat 400B are similar to features of the die 500A, capacitor 300A and moat 400A in FIGS. 3A-3B. Thus, references numerals used to designate the various components of the die 500B, capacitor 300B and moat 400B are identical to those used for identifying the corresponding components of the die 500A, capacitor 300A and moat 400A in FIGS. 3A-3B, except that a "B" instead of an "A" has been added to the numerical identifier. Therefore, the structure and description for the various features of the die 500A, capacitor 300A and moat 400A in FIGS. 3A-3B are understood to also apply to the corresponding features of the die 500B, capacitor 300B and moat 400B in FIGS. 4A-4B, except as described below.

The die 500B, capacitor 300B and moat 400B differ from the die 500A, capacitor 300A and moat 400A in that the first metal layer 530B extends across the moat 400B, thereby allowing an electrical communication across the moat 400B. The topcoat insulation layer (e.g., fourth insulation layer) 600B extends over the trench portions 420B, 440B in the first and second interlayer insulator layers 570B, 590B and over the trench portion 620B in the first and second insulation layers 520B, 540B to a location over (e.g., adjacent) a portion of the first metal layer 530B, thereby defining a trench 630B in the topcoat insulation layer 600B that extends over the trench portions 420B, 440B. Therefore, the topcoat insulation layer 600B advantageously provides a moisture barrier between different portions of the first interlayer insulator layer 570B and between different portions of the second interlayer insulator layer 590B. This moisture barrier inhibits (e.g., prevents) moisture from flowing from one portion (e.g., right side of moat 400B in FIG. 4B) of the first and second interlayer insulator layers 570B, 590B to another portion (e.g., left side of moat 400B in FIG. 4B) of the first and second interlayer insulator layers 570B, 590B, thereby advantageously inhibiting (e.g., preventing) damage to the capacitor 300B from exposure to moisture that may travel along one or both of the first and second interlayer insulator layers 570B, 590B (e.g., from defects on a top portion or an edge portion of the die 500B).

Figure 5A:
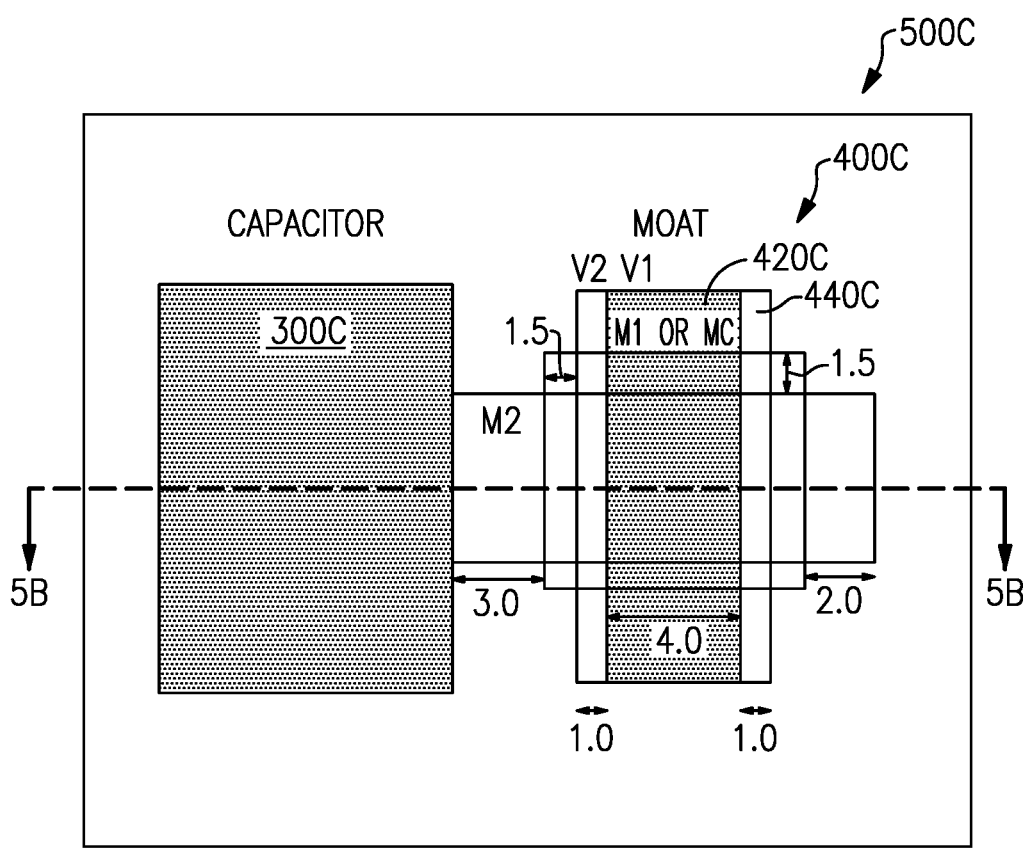
FIG. 5A is a schematic top view of a die with a capacitor and moat with a connection over the moat.
Figure 5B:
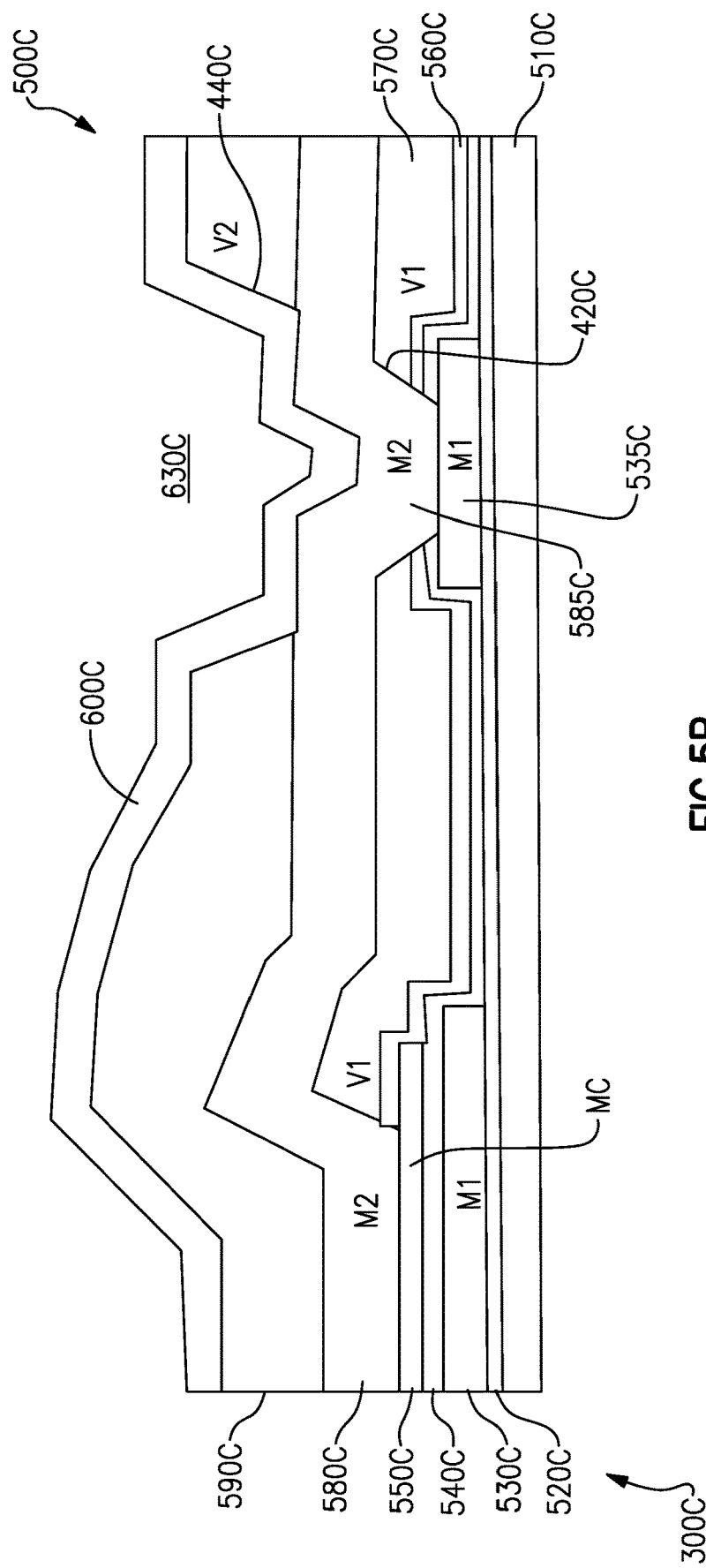
FIG. 5B is a cross-sectional side view of the die in FIG. 5A including the moat.

FIGS. 5A-5B schematically illustrate a top view and a cross-sectional view along line 5B-5B in FIG. 5A, respectively, of a die 500C with a capacitor 300C and a moat 400C. Some of the features of the die 500C, capacitor 300C and moat 400C are similar to features of the die 500A, capacitor 300A and moat 400A in FIGS. 3A-3B. Thus, references numerals used to designate the various components of the die 500C, capacitor 300C and moat 400C are identical to those used for identifying the corresponding components of the die 500A, capacitor 300A and moat 400A in FIGS. 3A-3B, except that a "C" instead of an "A" has been added to the numerical identifier. Therefore, the structure and description for the various features of the die 500A, capacitor 300A and moat 400A in FIGS. 3A-3B are understood to also apply to the corresponding features of the die 500C, capacitor 300C and moat 400C in FIGS. 5A-5B, except as described below.

The die 500C, capacitor 300C and moat 400C differ from the die 500A, capacitor 300A and moat 400A in that the third metal layer 580C extends across the moat 400C, thereby allowing an electrical communication across the moat 400C. The first metal layer 530C also provides a footer or pedestal 535C that supports at least a portion of the third metal layer 580C, as further discussed below.

The topcoat insulation layer (e.g., fourth insulation layer) 600C extends over the trench portion 440C in the second interlayer insulator layer 590C and over (e.g., directly over, adjacent) at least a portion of the third metal layer 580C. The third metal layer 580C defines a trench portion 585C (e.g., tapered trench portion). The portion of the topcoat insulation layer 600C that extends over the trench portion 440C in the second interlayer insulator layer 590C and the trench portion 585C of the third metal layer 580C defines a trench 630C (e.g., tapered or tapered step trench portion).

The trench portion 585C of the third metal layer 580C extends over (e.g., directly over, adjacent) the trench portion 420C in the first interlayer insulator layer 570C to a location over (e.g., directly over, adjacent) the footer or pedestal 535C. The pedestal 535A advantageously allows the trench portion 585C in the third metal layer 580C and the trench 630C in the topcoat insulation layer 600C to have a depth that inhibits (e.g., prevents) failure or damage to one or more layers of the die 500C.

Therefore, the topcoat insulation layer 600C advantageously provides a moisture barrier between different portions of the second interlayer insulator layer 590C, and the third metal layer 580C provide a barrier between different portions of the first interlayer insulator layer 570C. This moisture barrier inhibits (e.g., prevents) moisture from flowing from one portion (e.g., right side of moat 400C in FIG. 5B) of the first and second interlayer insulator layers 570C, 590C to another portion (e.g., left side of moat 400C in FIG. 5B) of the first and second interlayer insulator layers 570C, 590C, thereby advantageously inhibiting (e.g., preventing) damage to the capacitor 300C from exposure to moisture that may travel along one or both of the first and second interlayer insulator layers 570C, 590C (e.g., from defects on a top portion or an edge portion of the die 500C).

Figure 6A:
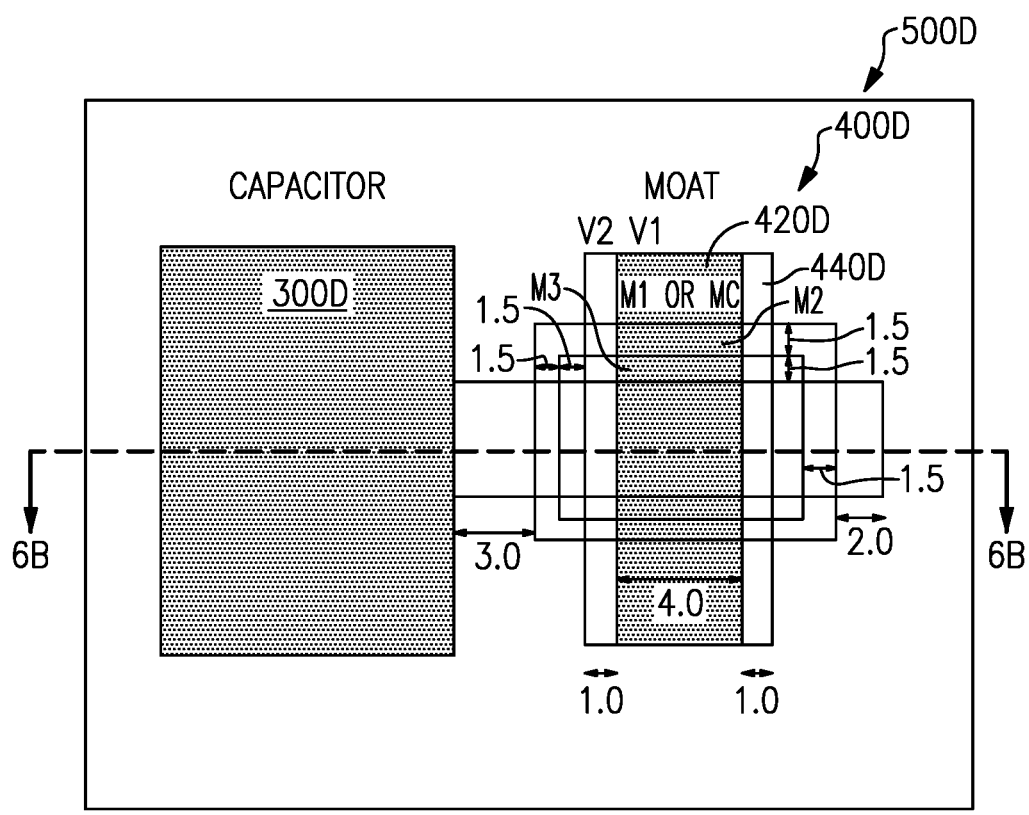
FIG. 6A is a schematic top view of a die with a capacitor and moat with a connection over the moat.
Figure 6B:
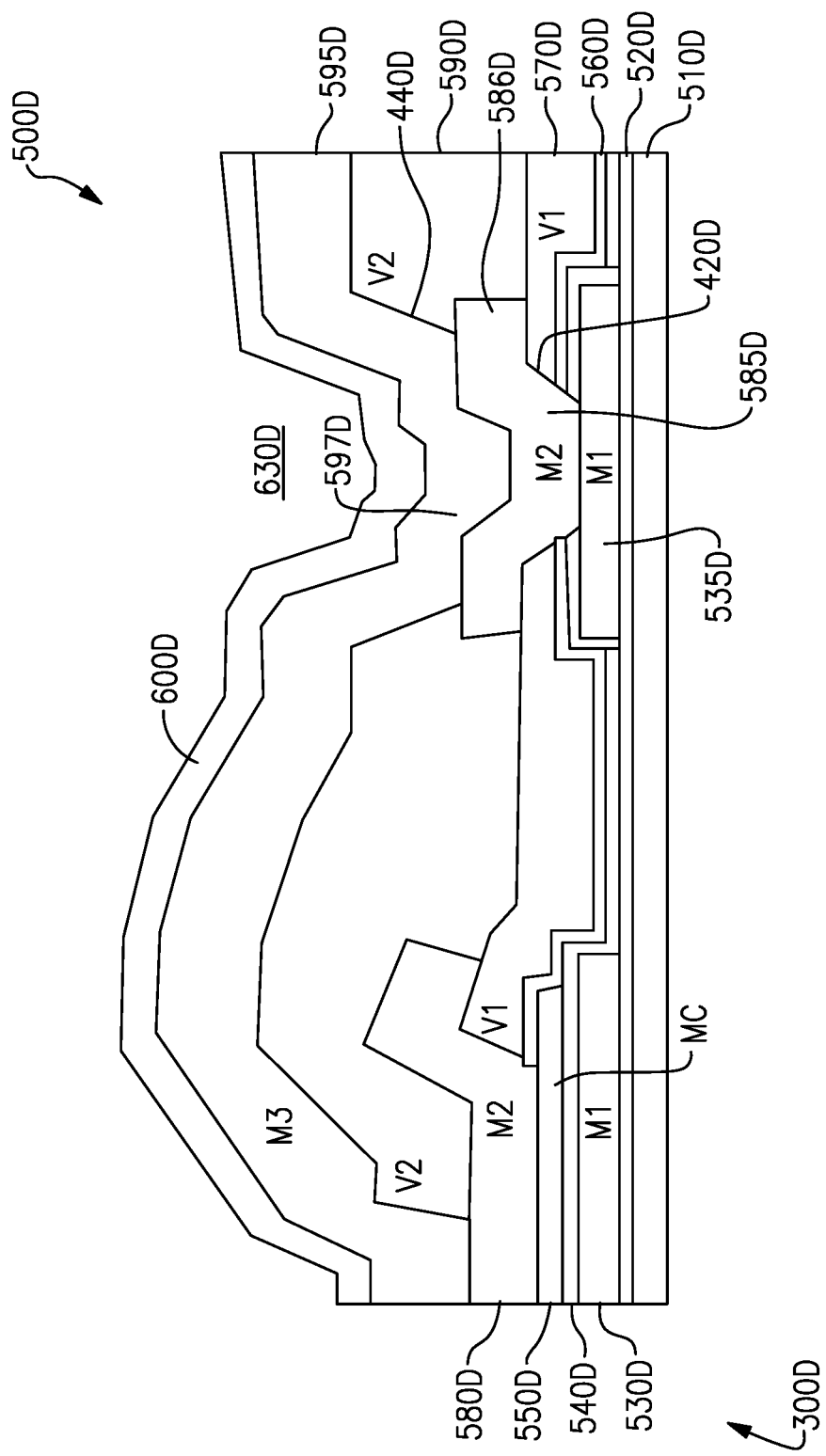
FIG. 6B is a cross-sectional side view of the die in FIG. 6A including the moat.

FIGS. 6A-6B schematically illustrate a top view and a cross-sectional view along line 6B-6B in FIG. 6A, respectively, of a die 500D with a capacitor 300D and a moat 400D. Some of the features of the die 500D, capacitor 300D and moat 400D are similar to features of the die 500C, capacitor 300C and moat 400C in FIGS. 5A-5B. Thus, references numerals used to designate the various components of the die 500D, capacitor 300D and moat 400D are identical to those used for identifying the corresponding components of the die 500C, capacitor 300C and moat 400C in FIGS. 5A-5B, except that a "D" instead of a "C" has been added to the numerical identifier. Therefore, the structure and description for the various features of the die 500C, capacitor 300C and moat 400C in FIGS. 5A-5B are understood to also apply to the corresponding features of the die 500D, capacitor 300D and moat 400D in FIGS. 6A-6B, except as described below.

The die 500D, capacitor 300D and moat 400D differ from the die 500C, capacitor 300C and moat 400C in that the third metal layer 580D does not extend across the moat 400D. Rather, the third metal layer 580D has a first portion 583D that extends along a length substantially equal to the length of the first metal layer 530D and shorter than a length of the length of the second insulation layer 540D. The third metal layer 580D also has a second portion 586D that defines a trench portion 585D that is supported on (e.g., disposed over, adjacent, in contact with) the footer or pedestal 535D of the first metal layer 530D. The trench portion 585D extends over the trench portion 420D in the first interlayer insulator layer 570D.

The die 500D also includes a fourth metal layer 595D (M3) that extends across the moat 400D, thereby allowing an electrical communication across the moat 400D. The fourth metal layer 595D extends over (e.g., directly over, adjacent) the second interlayer insulator layer 590D. The fourth metal layer 595D has a trench portion 597D (e.g., tapered trench portion) that extends over the trench portion 440D in the second interlayer insulator layer 590D and at least partially extends into the trench portion 585D of the third metal layer 580D. The fourth metal layer 595D can define a fourth electrode.

The topcoat insulation layer (e.g., fourth insulation layer) 600D extends over (e.g., directly over, adjacent) the fourth metal layer 595D. The portion of the topcoat insulation layer 600D that extends over the trench portion 597D in the fourth metal layer 595D defines a trench 630D (e.g., tapered or tapered step trench portion).

The pedestal 535D advantageously allows the trench portion 585D in the third metal layer 580D, the trench portion 597D in the fourth metal layer 595D, and the trench 630D in the topcoat insulation layer 600D to have a depth that inhibits (e.g., prevents) failure or damage to one or more layers of the die 500D.

Therefore, the topcoat insulation layer 600D and fourth metal layer 595D advantageously provide a moisture barrier between different portions of the second interlayer insulator layer 590D, and the trench portion 585D of the third metal layer 580D provides a barrier between different portions of the first interlayer insulator layer 570D. This moisture barrier inhibits (e.g., prevents) moisture from flowing from one portion (e.g., right side of moat 400D in FIG. 6B) of the first and second interlayer insulator layers 570D, 590D to another portion (e.g., left side of moat 400D in FIG. 6B) of the first and second interlayer insulator layers 570D, 590D, thereby advantageously inhibiting (e.g., preventing) damage to the capacitor 300D from exposure to moisture that may travel along one or both of the first and second interlayer insulator layers 570D, 590D (e.g., from defects on a top portion or an edge portion of the die 500D).

Figure 7A:
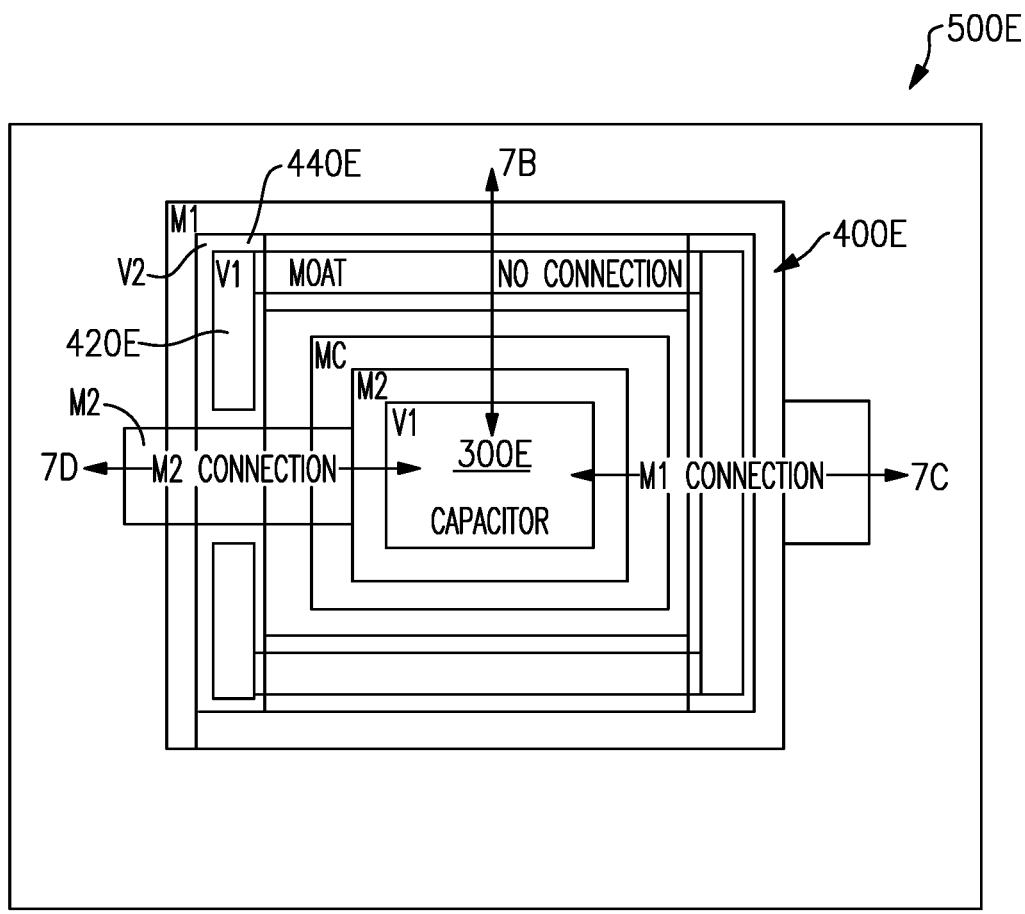
FIG. 7A is a schematic top view of a die with a capacitor and moat with a connection over the moat.
Figure 7B:
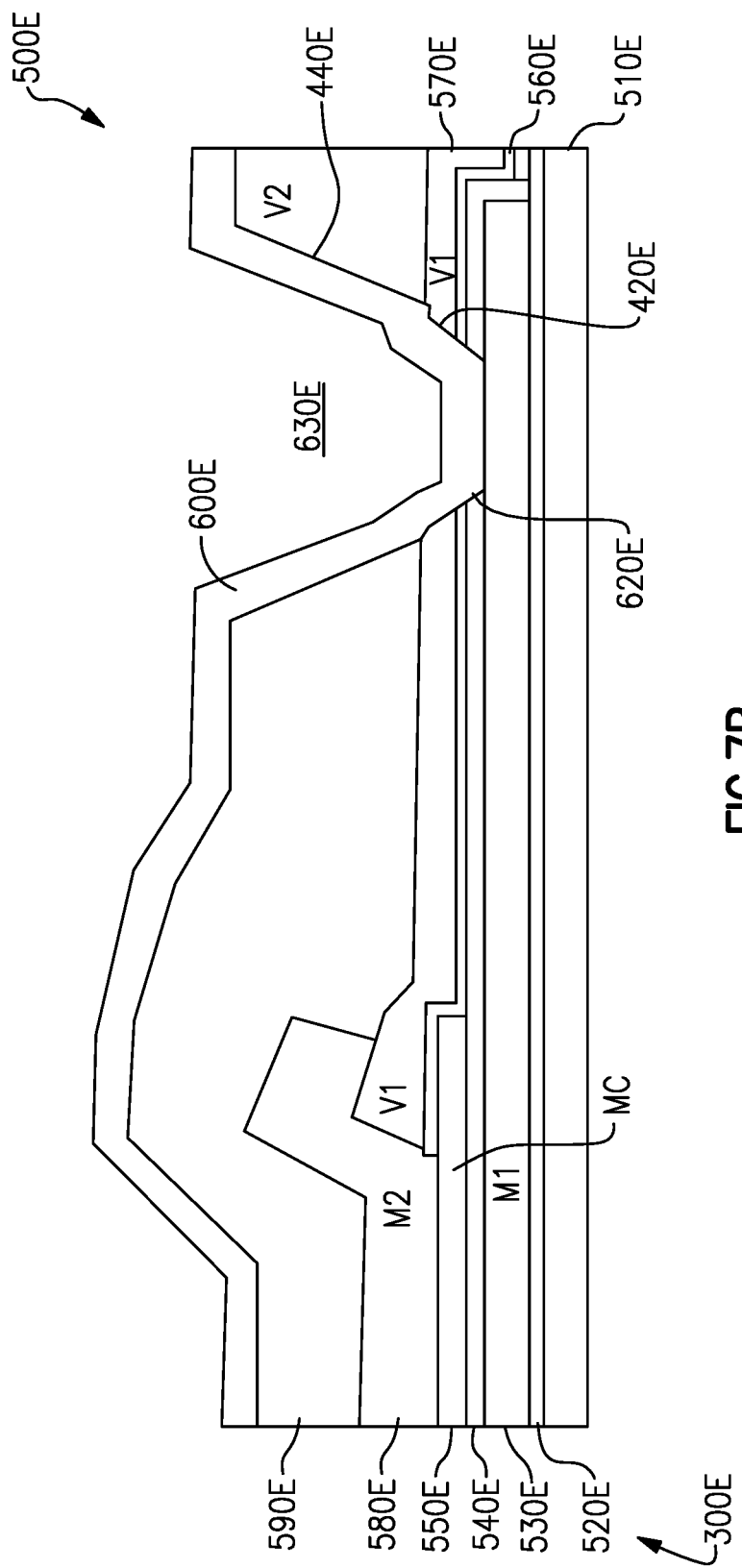
FIG. 7B is a cross-sectional side view of the die in FIG. 7A including the moat and without a connection over the moat.
Figure 7C:
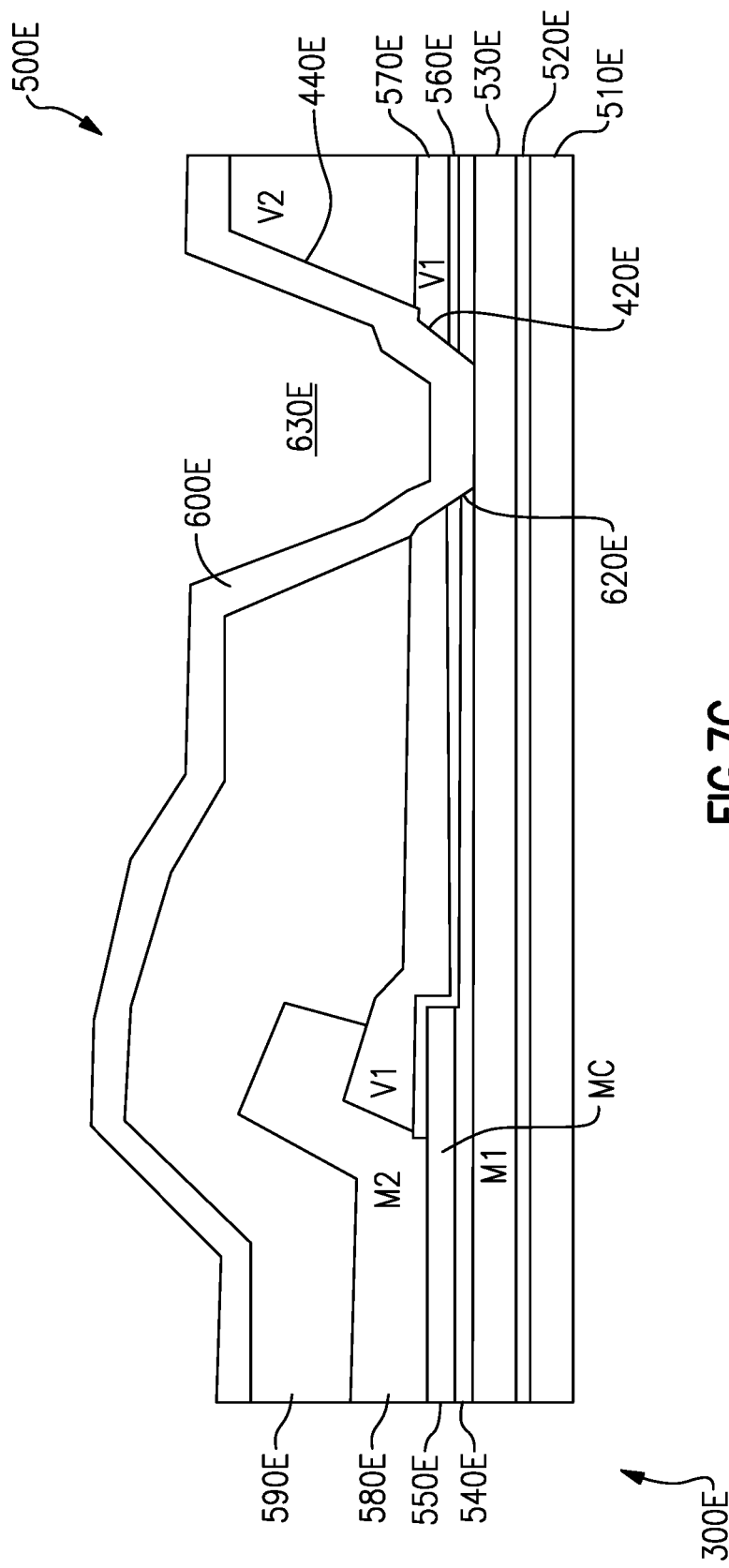
FIG. 7C is a cross-sectional side view of the die in FIG. 7A including the moat and without a connection over the moat.
Figure 7D:
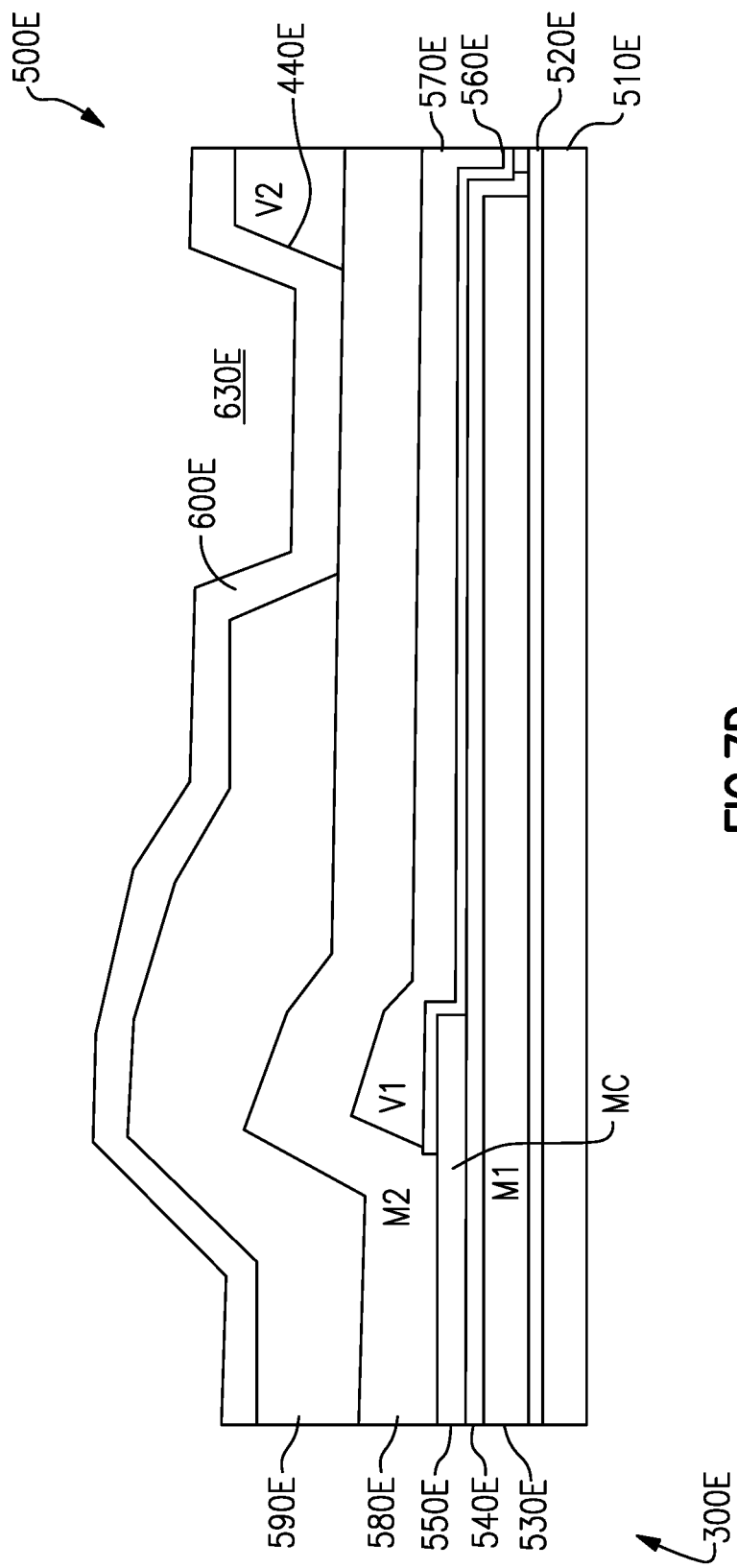
FIG. 7D is a cross-sectional side view of the die in FIG. 7A including the moat and without a connection over the moat.

FIG. 7A schematically illustrates a top view of a die 500E with a capacitor 300E and a moat 400E. FIG. 7B shows a cross-sectional view taken along line 7B in FIG. 7A. FIG. 7C shows a cross-sectional view taken along line 7C in FIG. 7A. FIG. 7D shows a cross-sectional view taken along line 7D in FIG. 7A. Some of the features of the die 500E, capacitor 300E and moat 400E are similar to features of the die 500C, capacitor 300C and moat 400C in FIGS. 5A-5B. Other features of the die 500E, capacitor 300E and moat 400E are similar to features of the die 500B, capacitor 300B and moat 400B in FIGS. 4A-4B. Thus, references numerals used to designate the various components of the die 500E, capacitor 300E and moat 400E are identical to those used for identifying the corresponding components of the die 500B, 500C, capacitor 300B, 300C and moat 400B, 400C in FIGS. 4A-5B, except that a "E" instead of a "B" or "C" has been added to the numerical identifier. Therefore, the structure and description for the various features of the die 500B, 500C capacitor 300B, 300C and moat 400B, 400C in FIGS. 4A-5B are understood to also apply to the corresponding features of the die 500E, capacitor 300E and moat 400E in FIGS. 7A-7D, except as described below.

As shown in FIG. 7A, the moat 400E around (e.g., surrounds, circumscribes) the capacitor 300E, thereby providing a moisture barrier between the capacitor 300E and area outside the moat 400E. The trench portion 440E of the moat 400E extends around (e.g., surrounds, circumscribes) the capacitor 300E, while the trench portion 420E of the moat 400E extends at least partially around (e.g., less than entirely around) the capacitor 300E.

FIG. 7B shows a cross-sectional view of the die 500E along line 7B in FIG. 7A, where no electrical connection is provided across the moat 400E. The cross-section of the die 500E along line 7B in FIG. 7A is similar to the cross-section of the die 500B in FIG. 4B, except that the first metal layer 530E does not extend completely across the die 500E. The first metal layer 530E extends across the moat 400E but has a length smaller than a length of the substrate 510E. The trench 630E in the topcoat insulation layer 600E extends over the trench portions 420E, 440E of the moat 400E. Therefore, the topcoat insulation layer 600E advantageously provides a moisture barrier between different portions of the first interlayer insulator layer 570E and between different portions of the second interlayer insulator layer 590E. This moisture barrier inhibits (e.g., prevents) moisture from flowing across the moat 400E, thereby advantageously inhibiting (e.g., preventing) damage to the capacitor 300E from exposure to moisture (e.g., from defects on a top portion or an edge portion of the die 500E).

FIG. 7C shows a cross-sectional view of the die 500E along line 7C in FIG. 7A, where an electrical connection is provided across the moat 400E by the first metal layer 530E. The cross-section of the die 500E along line 7C in FIG. 7A is identical to the cross-section of the die 500B in FIG. 4B, and therefore the description provided above for FIG. 4B also applies to the cross-section of the die 500E in FIG. 7C.

FIG. 7D shows a cross-sectional view of the die 500E along line 7D in FIG. 7A, where an electrical connection is provided across the moat 400E by the third metal layer 580E. The cross-section of the die 500E along line 7D in FIG. 7A is similar to the cross-section of the die 500E along line 7B in FIG. 7A, except that the third metal layer 580E extends across the moat 400E and has a length approximately equal to the length of the substrate 510E. Additionally, there is no trench in the first interlayer insulator layer 570E. The third metal layer 580E extends over (e.g., directly over, adjacent, in contact with) the first interlayer insulator layer 570E. The trench 630E in the topcoat insulation layer 600E extends over the trench portion 440E of the second interlayer insulator layer 590E. Therefore, the topcoat insulation layer 600E advantageously provides a moisture barrier between different portions of the second interlayer insulator layer 590E. This moisture barrier inhibits (e.g., prevents) moisture from flowing across the moat 400E via the second interlayer insulator layer 590E, thereby advantageously inhibiting (e.g., preventing) damage to the capacitor 300E from exposure to moisture (e.g., from defects on a top portion or an edge portion of the die 500E).

Figure 8:
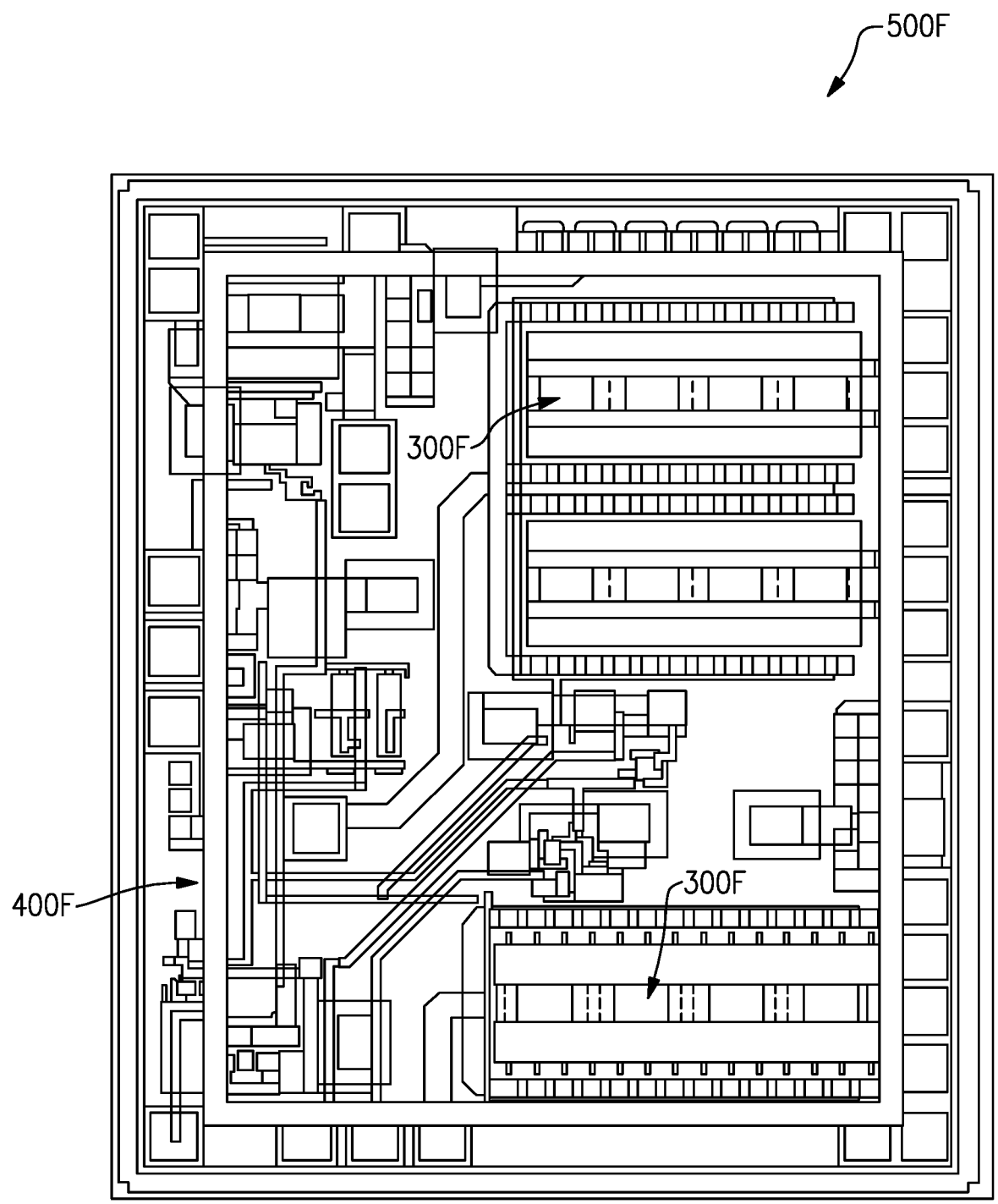
FIG. 8 is a schematic top view of a die with a moat formed around a portion of the die.

FIG. 8 schematically illustrates a top view of a die 500F with one or more capacitor 300F and a moat 400F. Some of the features of the capacitor(s) 300F and moat 400F can be similar to any of the capacitors 300A-300E and moat(s) 400A-400E described in this disclosure. Thus, references numerals used to designate the various components of the capacitor(s) 300F and moat 400F are identical to those used for identifying the corresponding components of the capacitor(s) 300A-300E and moat(s) 400A-400E above, except that an "F" has been added to the numerical identifier. Therefore, the structure and description for the various features of the capacitor(s) 300A-300E and moat(s) 400A-400E are understood to also apply to the corresponding features of the die capacitor 300F and moat 400F in FIG. 8, except as described below.

The die 500F differ from the die(s) 500A-500E described above in that the moat 400F extends around (e.g., surrounds, circumscribes) multiple electrical components (e.g., multiple capacitor(s) 300F). The moat 400F can have a similar structure as any of the moat(s) 400A-400E described above. Therefore, the moat 400F advantageously provides a moisture barrier around at least a portion of (e.g., a majority of, substantially all of) the die 500F to inhibit (e.g., prevent) moisture from flowing from outside the moat 400F to the electrical components surrounded by the moat 400F, thereby advantageously inhibiting (e.g., preventing) damage to the electrical components (e.g., capacitor(s) 300F) from exposure to moisture that may travel from edge defects on the die 500F.

Figure 9:
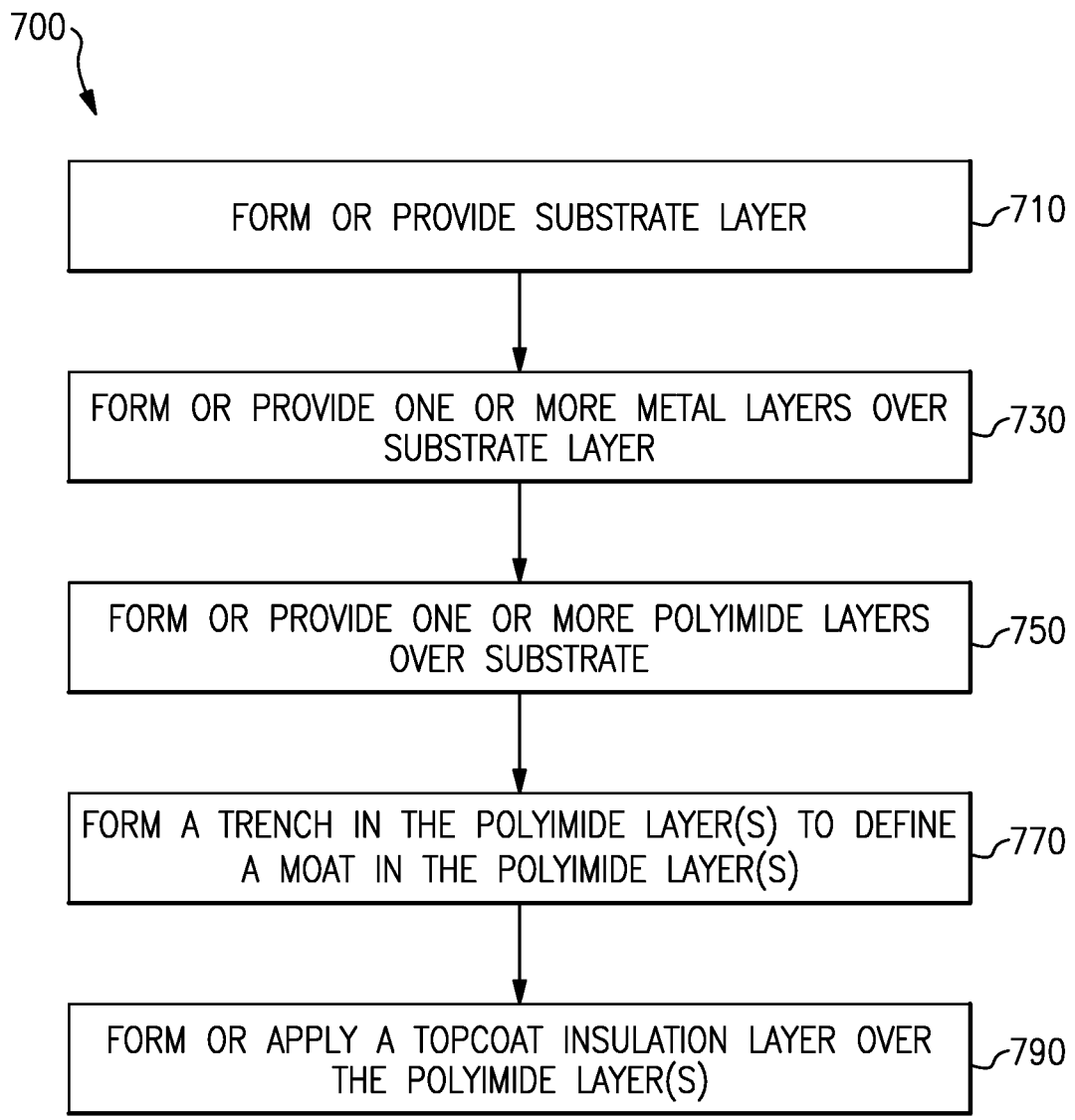
FIG. 9 is a block diagram of a method for manufacturing a die with a moat in one or more polymer layers.

FIG. 9 shows a method 700 of making a die with a moat in a polymer interlevel dielectric layer, such as the die 500A-500E with moat 400A-400E. The method 700 includes the step of forming or providing a substrate layer 710, such as the substrate layer 510A-510E described above. The method 700 also includes the step of forming or providing one or more metal layers 730 over the substrate layer, such as the first metal layer 530A-530E, second metal layer 550A-550E, third metal layer 580A-580E, or fourth metal layer 595D. Optionally, an insulation layer (e.g., silicon nitride layer) can be applied at least partially between metal layers, such as insulation layers 520A-520E, 540A-540E, 560A-560E. The method 700 also includes forming or applying one or more polymer interlevel dielectric layers (e.g., of polyimide) 750, such as interlayer insulator layers 570A-570E, 590A-590E. A trench is formed 770 in the interlayer insulator layers. Optionally, the material (e.g., polyimide) of the interlayer insulator layers is etched to form the trench. The trench can be formed in a tapered or stepped tapered manner. Advantageously, the trench in each interlayer insulator layer separates (e.g., completely separates) one side of the interlayer insulator layer from another side of the interlayer insulator layer (e.g., making the interlayer insulator layer discontinuous), thereby inhibiting (e.g., preventing) moisture from traveling across the interlayer insulator layer across the trench. The method 700 also includes the step of forming or applying a topcoat insulation layer 790, such as topcoat insulation layer 600A-600E, over the interlayer insulator layer(s), including over the trench. Optionally, the portion of the topcoat insulation layer that extends over the trench in the interlayer insulator layer(s) extends to the location of a layer under the interlayer insulator layer(s), such as a metal layer, an insulation layer, or the substrate layer. The topcoat insulation layer is advantageously impervious to moisture.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a sub combination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the semiconductor die with the moisture barrier need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed moisture barrier in a semiconductor die.

What is claimed is:

1. A semiconductor die, comprising:
   a substrate layer;
   a capacitor over the substrate layer, the capacitor having four sides;
   a moat that surrounds the four sides of the capacitor to produce a moisture barrier between the capacitor and an area outside the moat, the moat includes a first trench portion that surrounds the capacitor and a second trench portion that partially surrounds the capacitor;
   a plurality of metal layers disposed over the substrate layer that at least partially define the capacitor, the plurality of metal layers including a first metal layer that extends under the moat on all four sides of the capacitor but is smaller in size than the substrate layer, a second metal layer over a portion of the first metal layer, the second metal layer extends under the moat on at least one side of the capacitor, but not under the moat on other sides of the capacitor;
   a plurality of polymer interlevel dielectric layers that partially define the capacitor, at least a first polymer interlevel dielectric layer disposed over portions of the substrate layer and under the four sides of the moat, a second polymer interlevel dielectric layer disposed over portions of the first metal layer and under the moat on at least one side of the capacitor, but not under the moat on other sides of the capacitor, the second polymer interlevel dielectric layer being tapered along the second trench portion that partially surrounds the capacitor, and a third polymer interlevel dielectric layer disposed over portions of the second metal layer, the third polymer interlevel dielectric layer being tapered along the first trench portion that surrounds the capacitor; and
   a topcoat insulation layer defining a top surface of a semiconductor die, the topcoat insulation layer extends over the capacitor and the moat to inhibit moisture from traveling along the plurality of polymer interlevel dielectric layers.

2. The semiconductor die of claim 1 wherein the plurality of polymer interlevel dielectric layers include one or more polyimide layers.

3. The semiconductor die of claim 1 wherein the first plurality of metal layers are one or more electrodes of the capacitor.

4. The semiconductor die of claim 1 further comprising one or more insulation layers disposed at least partially over at least one of the plurality of metal layers.

5. The semiconductor die of claim 1 wherein the first and second trench portions taper toward the substrate layer.

6. The semiconductor die of claim 1 wherein the plurality of polymer interlevel dielectric layers include at least two layers and that are stepped relative to each other.

7. The semiconductor die of claim 1 further comprising a plurality of interlayer insulation layers with a first interlayer insulation layer extending over the first metal layer and under the moat on least one side of the capacitor, but not under the moat on three sides of the capacitor.

8. The semiconductor die of claim 1 further comprising a plurality of interlayer insulation layers with at least two interlayer insulation layers extending over the first metal layer and under the moat on least one side of the capacitor, but not under the moat on three sides of the capacitor.

9. A radiofrequency module, comprising:
   a printed circuit board; and
   a semiconductor die mounted on the printed circuit board and including (a) a substrate layer, (b) a capacitor over the substrate layer, the capacitor having four sides, (c) a moat that surrounds the four sides of the capacitor to produce a moisture barrier between the capacitor and an area outside the moat, the moat includes a first trench portion that surrounds the capacitor and a second trench portion that partially surrounds the capacitor; (d) a plurality of metal layers disposed over the substrate layer that at least partially define the capacitor, the plurality of metal layers including a first metal layer that extends under the moat on all four sides of the capacitor but is smaller in size than the substrate layer, a second metal layer over a portion of the first metal layer, the second metal layer extends under the moat on at least one side of the capacitor, but not under the moat on other sides of the capacitor, (e) a plurality of polymer interlevel dielectric layers that partially define the capacitor, at least a first polymer interlevel dielectric layer disposed over portions of the substrate layer and under the four sides of the moat, and a second polymer interlevel dielectric layer disposed over portions of the first metal layer and under the moat on at least one side of the capacitor, but not under the moat on other sides of the capacitor, the second polymer interlevel dielectric layer being tapered along at least one side of the second trench portion that partially surrounds the capacitor, and a third polymer interlevel dielectric layer disposed over portions of the second metal layer, the third polymer interlevel dielectric layer being tapered along the first trench portion that surrounds the capacitor, and (f) a topcoat insulation layer disposed over defining a top surface of the semiconductor die, the topcoat insulation layer extends over the capacitor and the moat to inhibit moisture from traveling along the plurality of polymer interlevel dielectric layers.

10. The radiofrequency module of claim 9 wherein the plurality of polymer interlevel dielectric layers are one or more polyimide layers.

11. The radiofrequency module of claim 9 wherein the first plurality of metal layers are one or more electrodes of the capacitor.

12. The radiofrequency module of claim 9 further comprising one or more insulation layers disposed at least partially over at least one of the plurality of metal layers.

13. The radiofrequency module of claim 9 wherein the plurality of polymer interlevel dielectric layers include at least two layers that are stepped relative to each other.

14. The radiofrequency module of claim 9 further comprising a plurality of interlayer insulation layers with a first interlayer insulation layer extending over the first metal layer and under the moat on least one side of the capacitor, but not under the moat on three sides of the capacitor.

15. A wireless mobile device, comprising:
one or more antennas;
a front end system that communicates with the one or more antennas; and
a semiconductor die including (a) a substrate layer, (b) a capacitor over the substrate layer, the capacitor having four sides, (c) a moat that surrounds the four sides of the capacitor to produce a moisture barrier between the capacitor and an area outside the moat, the moat includes a first trench portion that surrounds the capacitor and a second trench portion that partially surrounds the capacitor; (d) a plurality of metal layers disposed over the substrate layer that at least partially define the capacitor, the plurality of metal layers including a first metal layer that extends under the moat on all four sides of the capacitor but is smaller in size that the substrate layer, a second metal layer over a portion of the first metal layer, the second metal layer extends under the moat on at least one side of the capacitor, but not under the moat on other sides of the capacitor, (e) a plurality of polymer interlevel dielectric layers that partially define the capacitor, at least a first polymer interlevel dielectric layer disposed over the substrate layer and under the four sides of the moat, a second polymer interlevel dielectric layer disposed over portions of the first metal layer and under the moat on at least one side of the capacitor, but not on other sides of the capacitor, the second polymer interlevel dielectric layer being tapered along the second trench portion that partially surrounds the capacitor, and a third polymer interlevel dielectric layer disposed over portions of the second metal layer, the third polymer interlevel dielectric layer being tapered along the first trench portion that surrounds the capacitor, and (f) a topcoat insulation layer defining a top surface of the semiconductor die, the topcoat insulation layer extends over the capacitor and the moat to inhibit moisture from traveling along the plurality of polymer interlevel dielectric layers.

16. The wireless mobile device of claim 15 wherein the plurality of polymer interlevel dielectric layers include one or more polyimide layers.

17. The wireless mobile device of claim 15 wherein the first plurality of metal layers are one or more electrodes of the capacitor.

18. The wireless mobile device of claim 15 further comprising one or more insulation layers disposed at least partially over at least one of the plurality of metal layers.

19. The wireless mobile device of claim 15 wherein the plurality of polymer interlevel dielectric layers include at least two layers that are stepped relative to each other.

20. The wireless mobile device of claim 15 further comprising a plurality of interlayer insulation layers with a first interlayer insulation layer extending over the first metal layer and under the moat on least one side of the capacitor, but not under the moat on three sides of the capacitor.

* * * * *